United States Patent
Horowy et al.

(10) Patent No.: US 8,193,818 B2
(45) Date of Patent: Jun. 5, 2012

(54) PARTIAL CORONA DISCHARGE DETECTION

(75) Inventors: John Horowy, Rockford, IL (US); Neal D. Clements, Roscoe, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 580 days.

(21) Appl. No.: 12/354,151

(22) Filed: Jan. 15, 2009

(65) Prior Publication Data

US 2010/0176816 A1 Jul. 15, 2010

(51) Int. Cl.
- *G01R 31/08* (2006.01)
- *G01R 31/12* (2006.01)
- *H01H 9/50* (2006.01)

(52) U.S. Cl. ........ 324/536; 324/537; 324/535; 324/532; 324/117 R; 324/126; 324/127; 361/679.01; 361/600

(58) Field of Classification Search .......... 324/536, 324/537, 535, 532, 117 R, 126, 127; 361/679.01, 361/600
See application file for complete search history.

(56) References Cited

U.S. PATENT DOCUMENTS

| | | | | |
|---|---|---|---|---|
| 2,455,456 A | * | 12/1948 | Whittaker | 340/870.05 |
| 4,831,327 A | * | 5/1989 | Chenier et al. | 324/127 |
| 4,886,980 A | * | 12/1989 | Fernandes et al. | 307/64 |
| 5,015,945 A | * | 5/1991 | Radun | 324/127 |
| 5,416,418 A | * | 5/1995 | Maureira et al. | 324/535 |
| 5,434,509 A | | 7/1995 | Blades | |
| 6,366,076 B1 | * | 4/2002 | Karrer et al. | 324/117 R |
| 6,563,296 B2 | * | 5/2003 | Cooke | 324/127 |
| 6,680,608 B2 | * | 1/2004 | Kojovic | 324/127 |
| 6,885,183 B2 | * | 4/2005 | Kato | 324/117 R |
| 6,963,195 B1 | * | 11/2005 | Berkcan | 324/117 R |
| 7,180,303 B1 | | 2/2007 | Chen et al. | |
| 7,606,298 B1 | * | 10/2009 | Weber et al. | 375/224 |
| 2002/0011832 A1 | * | 1/2002 | Berkcan et al. | 324/127 |
| 2002/0125877 A1 | * | 9/2002 | Cooke | 324/127 |

(Continued)

FOREIGN PATENT DOCUMENTS

FR 0759511 * 12/2007

OTHER PUBLICATIONS

Agilent Technologies, "Advanced Design System", May 2006, pp. 1-32.*

*Primary Examiner* — Patrick Assouad
*Assistant Examiner* — Lamarr Brown
(74) *Attorney, Agent, or Firm* — Stephen G. Mican

(57) ABSTRACT

A method of detecting partial corona discharge in a targeted circuit of an electrical apparatus, comprises the steps of: wrapping a Rogowski coil around a leg of the targeted circuit to produce a Rogowski coil signal that represents electrical current rate of change in the leg of the targeted circuit; coupling the Rogowski coil signal to a three-dimensional display device that may represent the dimension of time, the dimension of amplitude as a function of a time, and the dimension of duration of amplitude as a function of time in successive periods of that have a preselected duration; monitoring the display device to detect deviations of the duration of amplitude as a function of time from a normal waveform in the leg of the targeted circuit; and correlating ones of the detected deviations of the duration of amplitude as a function of time from a normal waveform that exceed a preselected deviation level as indicative of partial corona discharge within the targeted circuit.

18 Claims, 1 Drawing Sheet

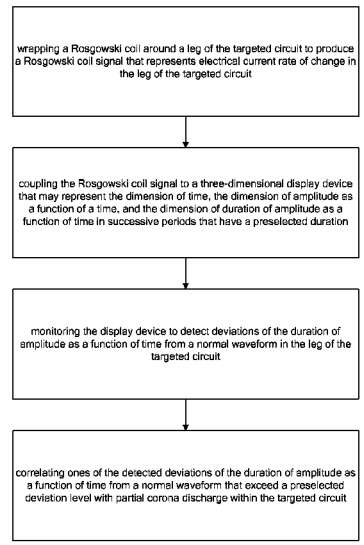

U.S. PATENT DOCUMENTS

| | | | |
|---|---|---|---|
| 2004/0201373 A1* | 10/2004 | Kato | 324/117 R |
| 2005/0102115 A1* | 5/2005 | Waldo et al. | 702/68 |
| 2006/0164100 A1* | 7/2006 | Moriyama et al. | 324/536 |
| 2006/0232263 A1* | 10/2006 | Kovanko et al. | 324/127 |
| 2007/0024269 A1* | 2/2007 | Tadatsu | 324/127 |
| 2007/0136010 A1 | 6/2007 | Gunn et al. | |
| 2007/0182401 A1* | 8/2007 | Driehorn et al. | 324/127 |
| 2007/0210787 A1* | 9/2007 | Ebenezer et al. | 324/127 |
| 2007/0252577 A1* | 11/2007 | Preusse | 324/117 R |
| 2007/0257661 A1* | 11/2007 | Mende et al. | 324/117 R |
| 2008/0007249 A1* | 1/2008 | Wilkerson et al. | 324/127 |
| 2008/0106254 A1* | 5/2008 | Kojovic | 324/127 |
| 2008/0303511 A1* | 12/2008 | Grno | 324/117 R |
| 2009/0153145 A1* | 6/2009 | Engel et al. | 324/537 |
| 2009/0219009 A1* | 9/2009 | Jansen et al. | 324/127 |
| 2009/0243590 A1* | 10/2009 | West et al. | 324/117 R |
| 2009/0289694 A1* | 11/2009 | Rieger et al. | 327/524 |
| 2010/0020457 A1* | 1/2010 | Kojovic et al. | 361/93.2 |
| 2010/0259275 A1* | 10/2010 | Grieshaber et al. | 324/522 |
| 2011/0109301 A1* | 5/2011 | Johnson et al. | 324/119 |

\* cited by examiner

```
┌─────────────────────────────────────────────────────────────┐
│                                                             │
│   wrapping a Rosgowski coil around a leg of the targeted   │
│   circuit to produce a Rosgowski coil signal that           │
│   represents electrical current rate of change in           │
│   the leg of the targeted circuit                           │
│                                                             │
└─────────────────────────────────────────────────────────────┘
                              │
                              ▼
┌─────────────────────────────────────────────────────────────┐
│                                                             │
│   coupling the Rosgowski coil signal to a three-dimensional │
│   display device that may represent the dimension of time,  │
│   the dimension of amplitude as a function of a time, and   │
│   the dimension of duration of amplitude as a function of   │
│   time in successive periods that have a preselected        │
│   duration                                                  │
│                                                             │
└─────────────────────────────────────────────────────────────┘
                              │
                              ▼
┌─────────────────────────────────────────────────────────────┐
│                                                             │
│   monitoring the display device to detect deviations of     │
│   the duration of amplitude as a function of time from a    │
│   normal waveform in the leg of the targeted circuit        │
│                                                             │
└─────────────────────────────────────────────────────────────┘
                              │
                              ▼
┌─────────────────────────────────────────────────────────────┐
│                                                             │
│   correlating ones of the detected deviations of the        │
│   duration of amplitude as a function of time from a        │
│   normal waveform that exceed a preselected deviation       │
│   level with partial corona discharge within the targeted   │
│   circuit                                                   │
│                                                             │
└─────────────────────────────────────────────────────────────┘
```

PARTIAL CORONA DISCHARGE DETECTION

FIELD OF THE INVENTION

The invention relates to corona discharge detection, and more particularly to partial corona detection in electrical circuitry.

BACKGROUND OF THE INVENTION

It is desirable to validate corona free operation of electrical equipment, operating in a reduced pressure environment, using non-invasive detection techniques. Radio frequency (RF) corona detection methods are sometimes effective for such validation, but test results vary due to field strength. Furthermore, testing of electrical equipment such as electrical power converters with properly designed electro-magnetic interference (EMI) filters and shielded enclosures further mask test results and attenuate signal strength, thus not allowing an accurate prediction of partial corona discharge onset.

A Rogowski coil may serve as a current sensor that develops an electrical output potential that is proportional to the rate of change of electrical current in the circuit that it measures. One advantage of a Rogowski coil over other types of current transformers usable as current sensing devices is that it may have an open-ended and flexible construction, and therefore it may wrap around a live conductor without disturbing it.

Since a Rogowski coil has an air core rather than an iron core, it has a low inductance and can respond to fast-changing currents. In addition, because it has no iron core to saturate, it is highly linear even when subjected to large currents, such as those used in electric power transmission, welding, or pulsed power applications. A correctly constructed Rogowski coil, with equally spaced windings, is largely immune to electromagnetic interference. Furthermore, since this type of coil has an output that increases with rate of sensed current change, its response increases at higher frequencies.

Until now, application of a Rogowski coil for on-line detection of partial corona discharge has been through the ground line of power equipment, and the Rogowski coil may sense the pulse current due to such discharge from the ground line by way of computer analysis. However, the frequencies of such current signals may range up to tens of mHz, and thus computer testing equipment capable of such analysis may be extremely costly. Furthermore, grounding is a complicated issue and other signals in the ground line may mask the partial corona discharge signals.

SUMMARY OF THE INVENTION

The invention generally comprises a method of detecting partial corona discharge in a targeted circuit of an electrical apparatus, comprising the steps of: wrapping a Rogowski coil around a leg of the targeted circuit to produce a Rogowski coil signal that represents electrical current rate of change in the leg of the targeted circuit; coupling the Rogowski coil signal to a three-dimensional display device that may represent the dimensions of time, amplitude as a function of a time, and duration of amplitude as a function of time in successive periods of that have a preselected duration; monitoring the display device to detect deviations of the duration of amplitude as a function of time from a normal waveform in the leg of the targeted circuit; and correlating ones of the detected deviations of the duration of amplitude as a function of time from a normal waveform that exceed a preselected deviation level with partial corona discharge within the targeted circuit.

DESCRIPTION OF THE DRAWINGS

FIG. 1 is a flow chart for a method of detecting partial corona discharge in a targeted circuit of an electrical apparatus according to at least one possible embodiment of the invention.

DETAILED DESCRIPTION OF THE INVENTION

FIG. 1 is a flow chart for a method of detecting partial corona discharge in a targeted circuit of an electrical apparatus according to at least one possible embodiment of the invention. The first step of the method is wrapping a Rogowski coil around a leg of the targeted circuit to produce a Rogowski coil signal that represents electrical current rate of change in the leg of the targeted circuit. The leg may be a live conductor in or feeding the targeted circuit, or it may be a ground return for the targeted circuit. The Rogowski coil is largely immune to external electromagnetic interference, so it is possible to wrap it around different live conductors within a single circuit to isolate portions of the circuit.

The second step of the method is coupling the Rogowski coil signal to a three-dimensional display device that may represent the dimension of time, the dimension of amplitude as a function of a time, and the dimension of duration of amplitude as a function of time in successive periods that have a preselected duration. An oscillographic display, such as an oscilloscope, may be a suitable display for such an application. Although an analogue real-time oscilloscope (ART)) or digital storage oscilloscope (DSO) is capable of such three-dimensional display, a digital phosphor oscilloscope (DPO) is preferable due to its superior frequency response and display resolution. Commercially available DPOs are capable of capturing signals in the 2 gHz range, they may record up to 200,000 records per second and up to 500,000 samples in a signal acquisition.

The display will recursively display successive periods of the Rogowski coil signal waveform. Although it is possible to select any duration for the display period, it may be desirable to select at least one complete cycle of the Rogowski coil signal waveform when it has a continuous alternating current (AC) pattern. It is possible to display any number of successive periods of the selected duration, but a large selected number may provide greater resolution of the duration of amplitude as a function of time dimension.

The third step of the method is monitoring the display device to detect deviations of the duration of amplitude as a function of time from a normal waveform in the leg of the targeted circuit. In the case of an oscillographic display, this monitoring would be by way of monitoring spurious signals in the Rogowski waveform characterised by their intensity in the duration of amplitude as a function of time dimension. This dimension may be by way of change of colour, in the case of a DPO DSO, or by way of a change of beam intensity, in the case of a DSO or ARTO.

The fourth step of the method is correlating ones of the detected deviations of the duration of amplitude as a function of time from a normal waveform that exceed a preselected deviation level with partial corona discharge within the targeted circuit. To calibrate the display for this purpose, it is desirable to include the step of injecting a known corona electrical potential into the targeted circuit to determine the preselected deviation level on the display in the duration of amplitude as a function of time dimension.

It is thereby possible to selectively test individual circuits or portions thereof for partial corona discharge occurrences in a non-invasive manner. The technique is simple and it provides consistent results with significant immunity to electromagnetic radiation generated by non-targeted circuits or other sources. It is also responsive to detecting high frequency partial corona discharge signals, even in the tens of mHz range. The described embodiments of the invention are only some illustrative implementations of the invention wherein changes and substitutions of the various parts and arrangement thereof are within the scope of the invention as set forth in the attached claims.

The invention claimed is:

1. A method of detecting partial corona discharge in a targeted circuit of an electrical apparatus, comprising the steps of:
   wrapping a Rogowski coil around a leg of the targeted circuit to produce a Rogowski coil signal that represents electrical current rate of change in the leg of the targeted circuit;
   coupling the Rogowski coil signal to a three-dimensional display device that may represent the dimension of time, the dimension of amplitude as a function of a time, and the dimension of duration of amplitude as a function of time in successive periods that have a preselected duration;
   monitoring the display device to detect deviations of the duration of amplitude as a function of time from a normal waveform in the leg of the targeted circuit; and
   correlating ones of the detected deviations of the duration of amplitude as a function of time from a normal waveform that exceed a preselected deviation level with partial corona discharge within the targeted circuit.

2. The method of claim 1, wherein the step of wrapping a Rogowski coil around a leg of the targeted circuit comprises wrapping the Rogowski coil around a live conductor in the circuit.

3. The method of claim 1, wherein the step of wrapping a Rogowski coil around a leg of the targeted circuit comprises wrapping the Rogowski coil around a ground return for the targeted circuit.

4. The method of claim 1, wherein the step of coupling the Rogowski coil signal to a three-dimensional display comprises coupling the Rogowski coil signal to an oscillographic display.

5. The method of claim 4, wherein the oscillographic display is of the digital phosphor oscilloscope (DPO) type.

6. The method of claim 1, wherein the preselected duration of each period is at least one cycle of the normal waveform in the leg of the targeted circuit.

7. The method of claim 1, wherein the step of monitoring the display device to detect deviations of the duration of amplitude as a function of time from a normal waveform in the leg of the targeted circuit comprises monitoring for at least a preselected number of successive periods.

8. The method of claim 1, further comprising the step of injecting a known corona electrical potential into the targeted circuit to determine the preselected deviation level.

9. A method of detecting partial corona discharge in a targeted circuit of an electrical apparatus, comprising the steps of:
   wrapping a Rogowski coil around a leg of the targeted circuit to produce a Rogowski coil signal that represents electrical current rate of change in the leg of the targeted circuit;
   coupling the Rogowski coil signal to a three-dimensional oscillographic display device that may represent the dimension of time, the dimension of amplitude as a function of a time, and the dimension of duration of amplitude as a function of time in successive periods that have a preselected duration;
   monitoring the display device to detect deviations of the duration of amplitude as a function of time from a normal waveform in the leg of the targeted circuit;
   injecting a known corona electrical potential into the targeted circuit to establish a predetermined deviation level for detected deviations of the duration of amplitude as a function of time sufficient to cause at least partial corona discharge in the targeted circuit; and
   correlating ones of the detected deviations of the duration of amplitude as a function of time from a normal waveform that exceed the preselected deviation level with partial corona discharge within the targeted circuit.

10. The method of claim 9, wherein the step of wrapping a Rogowski coil around a leg of the targeted circuit comprises wrapping the Rogowski coil around a live conductor in the circuit.

11. The method of claim 9, wherein the step of wrapping a Rogowski coil around a leg of the targeted circuit comprises wrapping the Rogowski coil around a ground return for the circuit.

12. The method of claim 9, wherein the oscillographic display is of the digital phosphor oscilloscope (DPO) type.

13. The method of claim 9, wherein the preselected duration of each period is at least one cycle of the normal waveform in the leg of the targeted circuit.

14. The method of claim 9, wherein the step of monitoring the display device to detect deviations of the duration of amplitude as a function of time level from the level of a normal waveform in the leg of the targeted circuit comprises monitoring for at least a preselected number of successive periods.

15. A method of detecting partial corona discharge in a targeted circuit of an electrical apparatus, comprising the steps of:
   wrapping a Rogowski coil around a leg of the targeted circuit to produce a Rogowski coil signal that represents electrical current rate of change in the leg of the targeted circuit;
   coupling the Rogowski coil signal to a three-dimensional oscillographic display device of the digital phosphor oscilloscope (DPO) type that may represent the dimension of time, the dimension of amplitude as a function of time, and the dimension of duration of amplitude as a function of time in successive periods that have a preselected duration;
   monitoring the display device to detect deviations of the duration of amplitude as a function of time from a normal waveform in the leg of the targeted circuit that each have a duration of at least one cycle of the normal waveform;
   injecting a known corona electrical potential into the targeted circuit to establish a predetermined deviation level for detected deviations of the duration of amplitude as a function of time sufficient to cause at least partial corona discharge in the targeted circuit; and
   correlating ones of the detected deviations of the duration of amplitude as a function of time level from a normal waveform that exceed the preselected deviation level with partial corona discharge within the targeted circuit.

16. The method of claim 15, wherein the step of wrapping a Rogowski coil around a leg of the targeted circuit comprises wrapping the Rogowski coil around a live conductor in the circuit.

17. The method of claim 15, wherein the step of wrapping a Rogowski coil around a leg of the targeted circuit comprises wrapping the Rogowski coil around a ground return for the circuit.

18. The method of claim 15, wherein the step of monitoring the display device to detect deviations of the duration of amplitude as a function of time level from the level of a normal waveform in the leg of the targeted circuit comprises monitoring for at least a preselected number of successive periods.

* * * * *